US012100321B2

(12) United States Patent
Wang

(10) Patent No.: US 12,100,321 B2
(45) Date of Patent: Sep. 24, 2024

(54) STRETCHABLE DISPLAY MODULE AND STRETCHABLE DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Wenqiang Wang, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 868 days.

(21) Appl. No.: 17/274,704

(22) PCT Filed: Jan. 27, 2021

(86) PCT No.: PCT/CN2021/073872
§ 371 (c)(1),
(2) Date: Mar. 9, 2021

(87) PCT Pub. No.: WO2022/151526
PCT Pub. Date: Jul. 21, 2022

(65) Prior Publication Data
US 2023/0117283 A1    Apr. 20, 2023

(30) Foreign Application Priority Data

Jan. 12, 2021    (CN) .......................... 202110035809.8

(51) Int. Cl.
*G09F 9/30*    (2006.01)
*B32B 3/26*    (2006.01)
(Continued)

(52) U.S. Cl.
CPC .............. *G09F 9/301* (2013.01); *B32B 3/266* (2013.01); *G06F 1/1652* (2013.01); *G09F 9/335* (2021.05); *B32B 2457/206* (2013.01)

(58) Field of Classification Search
CPC ........ G09F 9/301; G09F 9/335; G06F 1/1652; B32B 2457/20–208; B32B 3/266; B32B 3/30
See application file for complete search history.

(56) References Cited

U.S. PATENT DOCUMENTS

2016/0190223 A1    6/2016    Park et al.
2018/0052493 A1*   2/2018    Hong .................... G06F 1/1626
2020/0168824 A1*   5/2020    Park .................... H10K 77/111

FOREIGN PATENT DOCUMENTS

CN    108766977 A    11/2018
CN    109256487 A    1/2019
(Continued)

*Primary Examiner* — Mariceli Santiago
(74) *Attorney, Agent, or Firm* — The Roy Gross Law Firm, LLC; Roy Gross

(57) ABSTRACT

A stretchable display module and a stretchable display device are provided. The stretchable display module includes a display area and a non-display area. The display area includes a main display area and an edge display area. The stretchable display module includes a plurality of pixel islands and a plurality of connecting bridges. Each of the connecting bridges is connected to two adjacent pixel islands in the main display area. A plurality of opening groups is disposed between adjacent pixel islands in the edge display area. The opening groups include a plurality of openings arranged from the edge display area to the non-display area, and an area of the openings gradually decreases from the edge display area to the non-display area.

18 Claims, 11 Drawing Sheets

(51) Int. Cl.
*G06F 1/16* (2006.01)
*G09F 9/33* (2006.01)

(56) References Cited

FOREIGN PATENT DOCUMENTS

| | | |
|---|---|---|
| CN | 109599402 A | 4/2019 |
| CN | 110444575 A | 11/2019 |
| CN | 111244133 A | 6/2020 |
| CN | 112071884 A | 12/2020 |
| KR | 20180045968 A | 5/2018 |

* cited by examiner

STRETCHABLE DISPLAY MODULE AND STRETCHABLE DISPLAY DEVICE

CROSS REFERENCE TO RELATED APPLICATIONS

This application is a National Phase of PCT Patent Application No. PCT/CN2021/073872 having International filing date of Jan. 27, 2021, which claims the benefit of priority of Chinese Application No. 202110035809.8 filed Jan. 12, 2021. The contents of the above applications are all incorporated by reference as if fully set forth herein in their entirety.

FIELD

The present disclosure relates to the field of display and more specifically to a stretchable display module and a stretchable display device.

BACKGROUND

Stretchable organic light-emitting diodes (OLEDs) are formed by transfer printing of inorganic thin film. Specifically, inorganic electronic display devices and base materials having flexible structure are combined, thereby realizing stretchable screens. Stretchable flexible display technologies have wide and promising applications in fields of medical treatment, human-computer interaction, and vehicle-mounted display. Wherein, mechanical designs of flexible structures of base materials are vital to flexible display technologies.

It should be noted that stretchable display screens will be stretched, twisted, or bent when they are used. Under such complicated external forces, different degrees of stretch and deformation may occur in the screens, leading to damage to a pixel display device layer and rendering display screens unable to work normally. In addition, an edge of the stretchable display screens is provided with gate lines, touch-sensing driving lines, and signal lines and cannot endure excessive external stress. Therefore, they need to be protected to prevent significant deformation. However, when the screens are stretched, a stress gradient exists between the edge of the screens and a middle portion of the screens (display area). In extreme cases, when the screens are stretched to a certain degree, applied forces may concentrate on some parts and reach a peak.

As a result, a flexible design of edge areas of the stretchable display screens needs to be improved urgently.

SUMMARY

Embodiments of the present disclosure provide a stretchable display module and a stretchable display device to solve a following issue: when conventional stretchable display screens are stretched to a certain degree, applied forces may concentrate on an edge of the screens, leading to breakage and failure of the screens.

An embodiment of the present disclosure provides a stretchable display module, including a display area and a non-display area surrounding the display area. The display area includes a main display area and an edge display area defined between the main display area and the non-display area. The stretchable display module includes a plurality of pixel islands distributed in the display area in an array manner and a plurality of connecting bridges. Each of the pixel islands is provided with at least one pixel. Each of the connecting bridges is connected to two adjacent pixel islands in the main display area. A plurality of opening groups are disposed between adjacent pixel islands in the edge display area. Each of the opening groups includes a plurality of openings arranged from the edge display area to the non-display area, and an area of the openings gradually decreases from the edge display area to the non-display area.

In at least one embodiment of the present disclosure, each of the opening groups includes a first opening, an area of the first opening is greater than an area of other openings in a same opening group, the first opening includes a first end and a second end, which are opposite to each other, the first end does not exceed a connecting line between a center of a first pixel island and a center of a second pixel island, the second end does not exceed a connecting line between a center of a third pixel island and a center of a fourth pixel island, the first pixel island is disposed in the main display area and is adjacent to the first end, the second pixel island is adjacent to the first pixel island along a direction from the edge display area to the non-display area and is disposed in the edge display area, the third pixel island is disposed on a same side as the first pixel island and is adjacent to the second end, and the fourth pixel island is adjacent to the third pixel island along the direction from the edge display area to the non-display area and is disposed in the edge display area.

In at least one embodiment of the present disclosure, the opening group further includes a second opening, an area of the second opening is less than an area of other openings in a same opening group, and the second opening is defined on a side of a connecting line between the center of the second pixel island and the center of the fourth pixel island adjacent to the non-display area.

In at least one embodiment of the present disclosure, lengths of the openings in a same opening group gradually decrease along a direction from the display area to the non-display area.

In at least one embodiment of the present disclosure, in the same opening group, a length ratio of one opening to another opening adjacent to the one opening ranges from 1/2 to 3/4.

In at least one embodiment of the present disclosure, in the same opening group, distances between adjacent openings are equal.

In at least one embodiment of the present disclosure, the opening group includes an axisymmetric structure, and a symmetry axis of the opening group is perpendicular to the connecting line between the center of the first pixel island and the center of the third pixel island.

In at least one embodiment of the present disclosure, the openings are strip-shaped, circular, ellipse-shaped, trapezoid-shaped, cruciform-shaped, or quincunx-shaped.

In at least one embodiment of the present disclosure, a circle of the opening groups is disposed in the edge display area and surrounds the main display area.

In at least one embodiment of the present disclosure, the main display area includes a transition display area adjacent the edge display area, and widths of the connecting bridges in the transition display area gradually increase along a direction from the main display area to the non-display area.

In at least one embodiment of the present disclosure, the connecting bridges between the pixel islands adjacent to the opening groups in the transition display area include at least one straight first connecting bridge.

In at least one embodiment of the present disclosure, the connecting bridges between the adjacent pixel islands in corners of the transition display area include the at least one first bridge.

In at least one embodiment of the present disclosure, the transition display area includes a first sub-area, a second sub-area, and a third sub-area, which are arranged along the direction from the main display area to the non-display area, widths of the connecting bridges in the first sub-area, widths of the connecting bridges in the second sub-area, and widths of the connecting bridges of the third sub-area gradually increase along the direction from the main display area to the non-display area.

In at least one embodiment of the present disclosure, the stretchable module further includes a flexible substrate, and an organic layer and an inorganic layer which are stacked on the flexible substrate, wherein the openings pass through the organic layer, the inorganic layer, and the flexible substrate.

Correspondingly, an embodiment of the present disclosure further provides a stretchable display device, including a stretchable display module. The stretchable display module includes a display area and a non-display area surrounding the display area. The display area includes a main display area and an edge display area defined between the main display area and the non-display area. The stretchable display module includes a plurality of pixel islands distributed in the display area in an array manner and a plurality of connecting bridges. Each of the pixel islands is provided with at least one pixel. Each of the connecting bridges is connected to two adjacent pixel islands in the main display area. A plurality of opening groups are disposed between adjacent pixel islands in the edge display area. Each of the opening groups includes a plurality of openings arranged from the edge display area to the non-display area, and an area of the openings gradually decreases from the edge display area to the non-display area.

In at least one embodiment of the present disclosure, each of the opening groups includes a first opening, an area of the first opening is greater than an area of other openings in a same opening group, the first opening includes a first end and a second end, which are opposite to each other, the first end does not exceed a connecting line between a center of a first pixel island and a center of a second pixel island, the second end does not exceed a connecting line between a center of a third pixel island and a center of a fourth pixel island, the first pixel island is disposed in the main display area and is adjacent to the first end, the second pixel island is adjacent to the first pixel island along a direction from the edge display area to the non-display area and is disposed in the edge display area, the third pixel island is disposed on a same side as the first pixel island and is adjacent to the second end, and the fourth pixel island is adjacent to the third pixel island along the direction from the edge display area to the non-display area and is disposed in the edge display area.

In at least one embodiment of the present disclosure, the opening group further includes a second opening, an area of the second opening is less than an area of other openings in a same opening group, and the second opening is defined on a side of a connecting line between the center of the second pixel island and the center of the fourth pixel island adjacent to the non-display area.

In at least one embodiment of the present disclosure, the main display area includes a transition display area adjacent the edge display area, and widths of the connecting bridges in the transition display area gradually increase along a direction from the main display area to the non-display area.

In at least one embodiment of the present disclosure, in the same opening group, a length ratio of one opening to another opening adjacent to the one opening ranges from 1/2 to 3/4.

In at least one embodiment of the present disclosure, in the same opening group, distances between adjacent openings are equal.

Regarding the beneficial effects: in embodiments of the present disclosure, an edge display area is provided with a plurality of opening groups instead of an island-bridge structure. The opening groups include a plurality of openings arranged from the edge display area to a non-display area, and an area of the openings gradually decreases from the edge display area to the non-display area. Therefore, rigidity of the edge display area can be improved, and overly large deformation of the edge display area can be prevented. Furthermore, wrinkles can be prevented from being generated on the edge display area, especially in corners of the edge display area.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

REFERENCE NUMBERS

Figure 1:
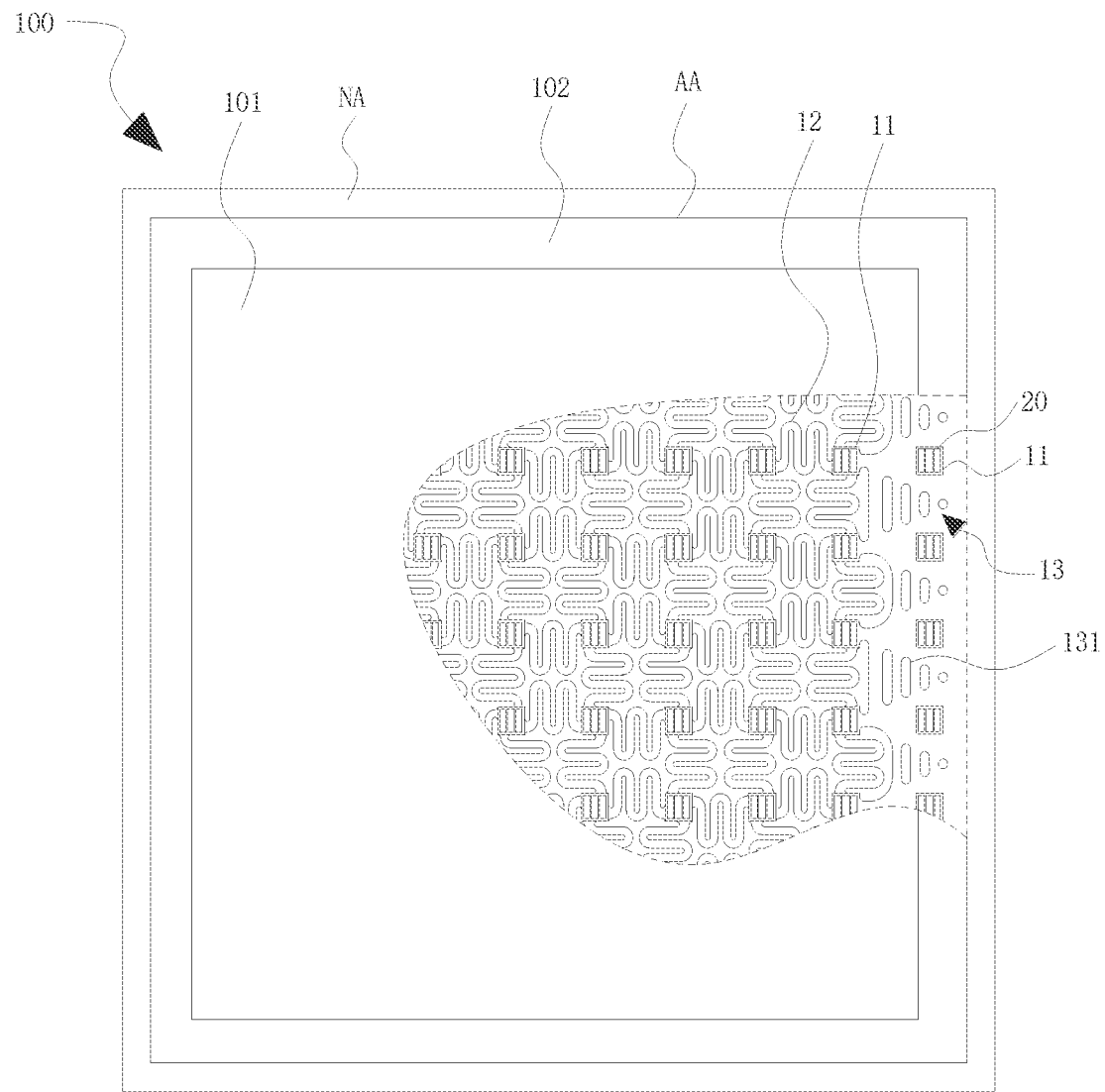
FIG. 1 is a schematic plan view showing a stretchable display module provided by an embodiment of the present disclosure.

| Reference numbers | Components | Reference numbers | Components |
|---|---|---|---|
| 100 | stretchable display module | 11 | pixel island |
| AA | display area | 12 | connecting bridge |
| NA | non-display area | 13 | opening group |
| 101 | main display area | 111 | first pixel island |
| 102 | edge display area | 112 | second pixel island |
| 1012 | middle display area | 113 | third pixel island |
| 1011 | transition display area | 114 | fourth pixel island |
| 10 | flexible substrate | 115 | fifth pixel island |
| 121 | first connecting bridge | 131 | opening |
| 1311 | first opening | 1312 | second opening |
| 10111 | first sub-area | 10112 | second sub-area |
| 10113 | third sub-area | 1201 | first connecting part |
| 1202 | first bending part | 1203 | second bending part |
| 1204 | third bending part | 1205 | second connecting part |
| 1313 | third opening | 1314 | fourth opening |
| 1315 | fifth opening | 20 | pixel |
| 21 | wire | 30 | first optical adhesive layer |
| 40 | second optical adhesive layer | 50 | first flexible layer |
| 60 | second flexible layer | 701 | recess |
| 90 | driving layer | 71 | first blocking layer |
| 72 | second blocking layer | 73 | first gate insulating layer |
| 74 | second gate insulating layer | 75 | interlayer dielectric layer |
| 81 | first planarization layer | 82 | second planarization layer |
| 83 | third planarization layer | 84 | organic filling layer |
| 91 | active layer | 92 | first gate |
| 93 | second gate | 94 | source/drain layer |

DETAILED DESCRIPTION

Hereinafter preferred embodiments of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure. It should be noted that described embodiments are merely used to construct the present disclosure and are not intended to limit the present disclosure. In the present disclosure, unless further description is made, terms such as "top" and "bottom" usually refer to a top of a device and a bottom of a device in an actual process or working status, and specifically, to the orientation as shown in the drawings. Terms such as "inside" and "outside" are based on an outline of a device.

Embodiments of the present disclosure provide a stretchable display module and a stretchable display device. The stretchable display module and the stretchable display device are described in detail below, respectively. It should be noted that the description order of embodiments does not mean preferred order of the embodiments.

Please refer to FIG. 1. An embodiment of the present disclosure provides a stretchable display module 100, including a display area AA and a non-display area NA surrounding the display area AA. The display area AA includes a main display area 101 and an edge display area 102 defined between the main display area 101 and the non-display area NA.

The stretchable display module 100 includes a plurality of pixel islands 11 and a plurality of connecting bridges 12. The pixel islands 11 are distributed in the display area AA in an array manner. Each of the pixel islands 11 is provided with at least one pixel 20. The connecting bridges 12 are configured to connect two adjacent pixel islands 11 with each other in the main display area 101.

Each of the connecting bridges 12 is provided with a plurality of wires. The wires are configured to connect the pixels 20 on adjacent pixel islands 11, thereby realizing transmission of signals.

In conventional stretchable display modules, applied forces significantly concentrate on an interface between a display area and a non-display area. As a result, an island-bridge structure near the interface is easily broken, leading to breakage of wires in the bridges and rendering the screens unable to work. Therefore, in the present disclosure, a flexible structure in an edge display panel is improved, and rigidity of such area is improved, thereby reducing risks of wire breakage in the area.

Specifically, a plurality of opening groups 13 are disposed between adjacent pixel islands 11 in the edge display area 102. The opening groups 13 include a plurality of openings 131 arranged from the edge display area 102 to the non-display area NA. Furthermore, an area of the openings 131 gradually decreases along a direction from the edge display area 102 to the non-display area NA.

The stretchable display module includes a flexible substrate. The flexible substrate includes the pixel islands 11, the connecting bridges 12, and the opening groups 13. The pixel islands 11 and the connecting bridges 12 in the main display area 101 constitute a physical structure. The flexible substrate in the main display area 101 further includes a plurality of hollow structures arranged in an array manner. The pixel islands 11 and the connecting bridges 12 in the main display area 101 defines the hollow structures. Except for the opening groups 13, the flexible substrate in the edge display area 102 is a physical structure. In the present embodiment, the pixel islands 11 are areas formed of the pixels having display function. A shape of the pixel islands 11 is not limited.

By providing island-bridge structures in the main display area and directly defining openings in the edge display area 102, rigidity of the edge display area 102 may be improved. Moreover, rigidity of the edge display area 102 gradually increases along the direction from the edge display area 102 to the non-display area NA. As a result, a problem of applied forces concentrating in certain parts caused by relatively large force gradient between the display area AA and the non-display area NA is alleviated.

Figure 2:
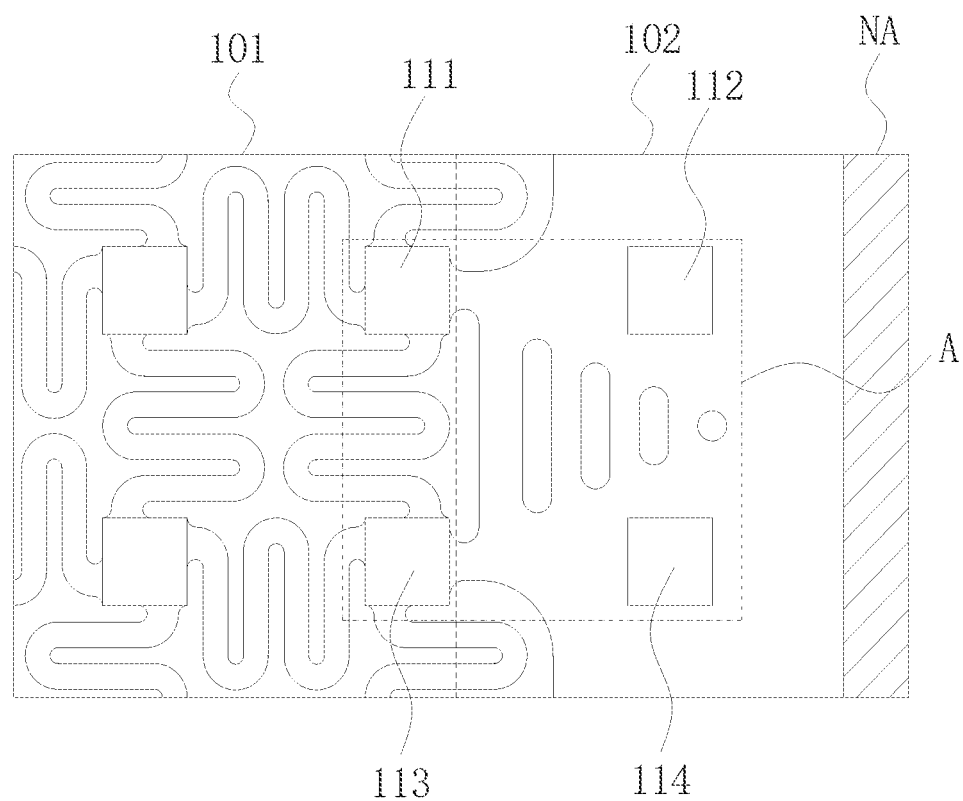
FIG. 2 is a structural schematic view showing an edge display area provided by an embodiment of the present disclosure.
Figure 3:
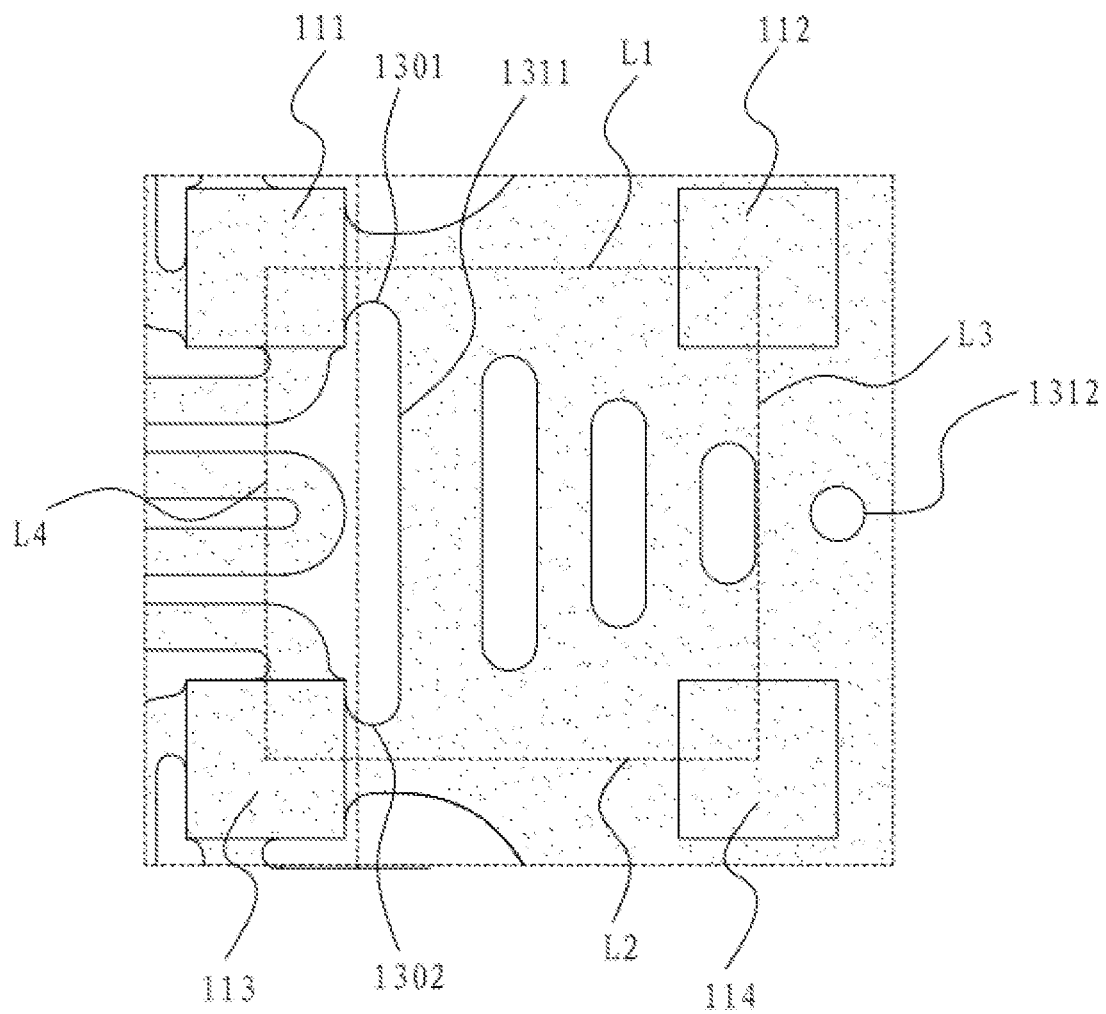
FIG. 3 is an enlarged view of position A in FIG. 2.

Specifically, please refer to FIG. 2 and FIG. 3, the opening groups 13 include a first opening 1311. An area of the first opening 1311 is greater than an area of other openings in a same opening group 13. That is, among the openings in the same opening group 13, the first opening 1311 is closest to the main display area 101.

Please refer to FIG. 3, the first opening 1311 includes a first end 1301 and a second end 1302 corresponding to each other. The first end 1301 does not exceed a connecting line L1 between a center of the first pixel island 111 and a center of the second pixel island 112. The second end 1302 does not exceed a connecting line L2 between a center of the third pixel island 113 and a center of the fourth pixel island 114. Therefore, it can be guaranteed that connecting lines between the first pixel island 111 and the second pixel island 112 and connecting lines between the third pixel island 113 and the fourth pixel island 114 would not be broken by the openings of the opening groups 13.

Please refer to FIG. 2 and FIG. 3. The first pixel island 111 is disposed in the main display area 101 and is adjacent to the first end 1301. The second pixel island 112 is along the direction from the edge display area 102 to the non-display area NA and is adjacent to the first pixel island 111. The third pixel island 113 is disposed on a same side as the first pixel island 111 and is adjacent to the second end 1302. The fourth pixel island 114 is along the direction from the edge display area 102 to the non-display area NA and is adjacent to the third pixel island 113 in the edge display area 102.

Furthermore, the opening groups 13 include a second opening 1312. An area of the second opening 1312 is less than other openings in a same opening group 13. That is, among the openings in the same opening group 13, the second opening 1312 is closest to the non-display area NA.

In the present embodiment, the second opening 1312 is defined on a side of a connecting line L3 between the center of the second pixel island 112 and the center of the fourth pixel island 114 near the non-display area NA.

In other embodiments, the second opening 1312 may be defined on a side of the connecting line L3 away from the display area NA. No matter which arrangement is used, the second opening 1312 should bypass wires between the second pixel island 112 and the fourth pixel island 114, thereby preventing the wires from being broken by the second opening 1312.

In one embodiment, each of the opening groups 13 includes an axisymmetric structure, and a symmetry axis of the opening group 13 is perpendicular to a connecting line L4 between the center of the first pixel island 111 and the center of the third pixel island 113.

In one embodiment, the openings 131 are strip-shaped, circular, ellipse-shaped, trapezoid-shaped, cruciform-shaped, or quincunx-shaped.

In one embodiment, in a same opening group 13, distances between adjacent openings 131 are equal.

In one embodiment, lengths of the openings 131 in a same opening group 13 gradually decrease along a direction from the display area AA to the non-display area NA.

In one embodiment, in a same opening group 13, a length ratio of one opening 131 to another opening 131 adjacent thereto ranges from 1/2 to 3/4.

In one embodiment, please refer to FIG. 1, a circle of the opening groups 13 is disposed in the edge display area 102 and surrounds the main display area 101.

Figure 4:
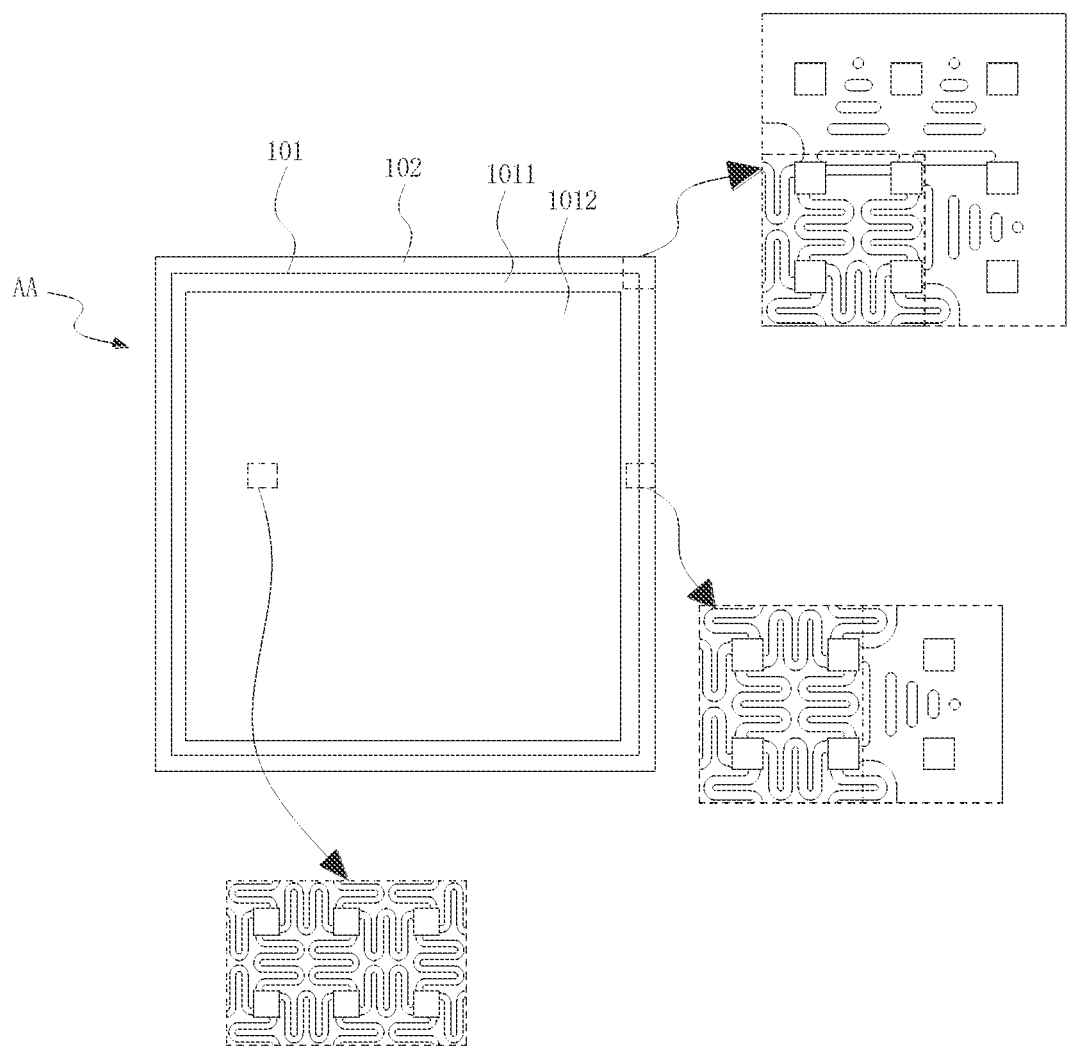
FIG. 4 is another structural schematic view showing a stretchable display module according to an embodiment of the present disclosure.
Figure 5:
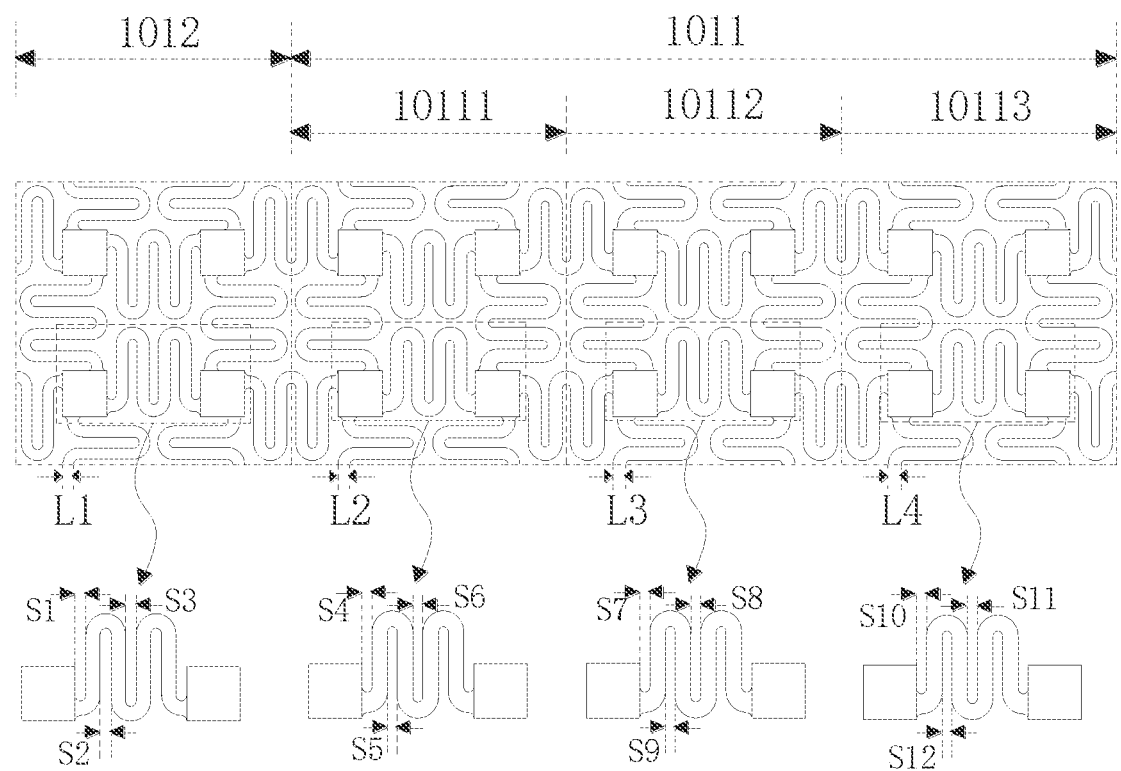
FIG. 5 is a structural schematic view showing a transition display area provided by an embodiment of the present disclosure.

Please refer to FIG. 4 and FIG. 5, the main display area 101 further includes a transition display area 1011 defined at an edge of the display area 101. Along the direction from the display area 101 to the non-display area NA, widths of the connecting bridges 12 in the transition display area 1011 gradually increase.

The main display area 101 further includes a middle display area 1012, and the transition display area 1011 surrounds the middle display area 1012.

Specifically, the transition display area 1011 includes a plurality of sub-areas arranged along the direction from the main display area 101 to the non-display area NA. Widths of the connecting bridges in the sub-areas gradually increase along the direction from the main display area 101 to the non-display area NA.

In one embodiment, in a same sub-area, widths of the connecting bridges gradually increase along the direction from the main display area 101 to the non-display area NA.

In one embodiment, in a same sub-area, widths of the connecting bridges are equal.

Please refer to FIG. 5, in the present embodiment, the transition display area 1011 includes three sub-areas. Specifically, the transition display area 1011 includes a first sub-area 10111, a second sub-area 10112, and a third sub-area 10113, which are arranged along the direction from the main display area 101 to the non-display area NA. Widths of the connecting bridges in the first sub-area 10111, widths of the connecting bridges in the second sub-area 10112, and widths of the connecting bridges of the third sub-area 10113 gradually increase along the direction from the main display 101 area to the non-display area NA.

Specifically, in the present embodiment, in a same sub-area, widths of the connecting bridges are equal. In one embodiment, in a same sub-area, widths of the connecting bridges gradually increase along the direction from the main display area 101 to the non-display area NA.

In this embodiment, in the middle display area 1012, widths of the connecting bridges are equal.

Figure 6:
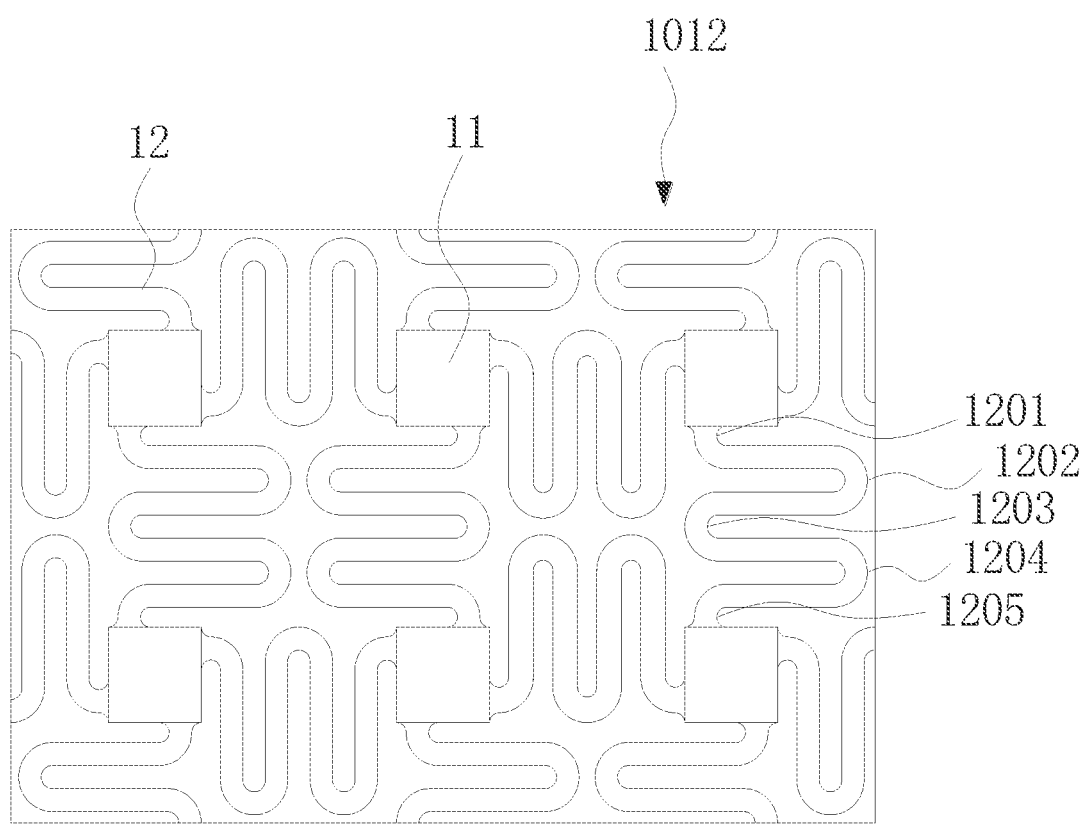
FIG. 6 is a structural schematic view showing a middle display area provided by an embodiment of the present disclosure.

Please refer to FIG. 6, the connecting bridges in the middle display area 1012 are curved bridges. That is, each of the connecting bridges in the middle display area 1012 includes at least one curved part.

Figure 7:
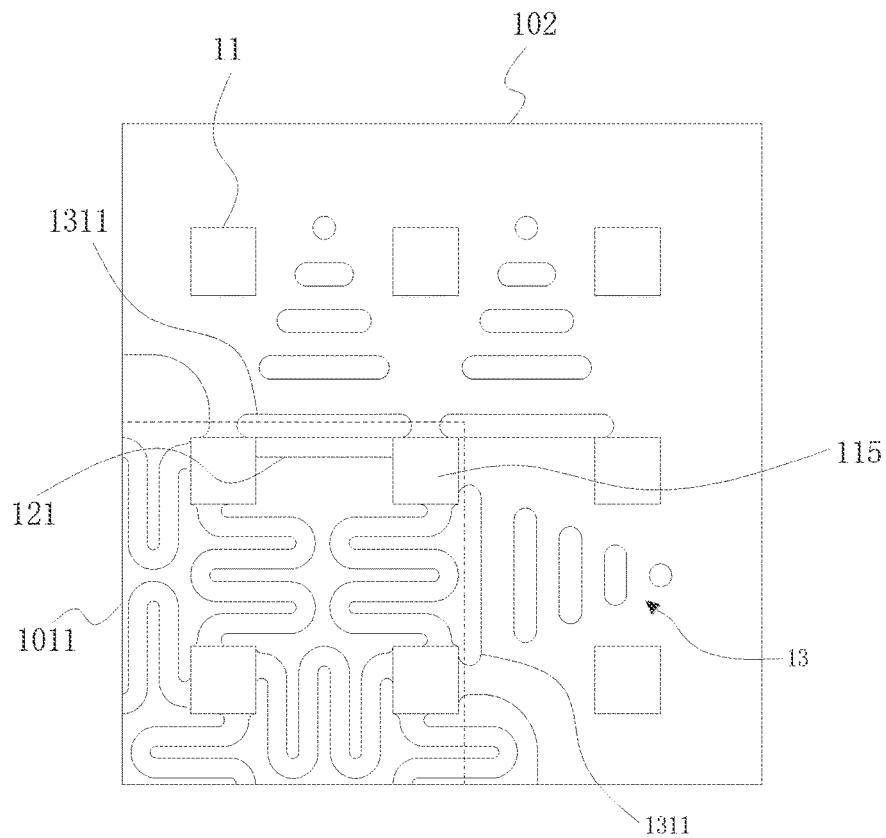
FIG. 7 is a structural schematic view showing a corner of the transition display area provided by the embodiment of the present disclosure.

Please refer to FIG. 7, some connecting bridges in the transition display area 101 include at least one curved edge. Other connecting bridges do not include the curved edge and may be straight bridges. Specifically, the connecting bridges 12 between the pixel islands 11 adjacent the opening groups 13 in the transition display area 1011 include at least one straight first connecting bridge 121, thereby improving rigidity of an edge area of the transition display area 1011.

Furthermore, the connecting bridges between adjacent pixel islands in corners of the transition display area 1011 include the at least one first connecting bridge 121. When the display module is stretched, compared with other display areas, each corner endures less applied forces. Moreover, wires are concentrated on the corners, occupying much space that can be used. As a result, connecting bridges in the corners may be designed to be a straight first connecting bridge. Compared with curved bridges, straight bridges occupy less space and have better rigidity. In addition, when the display module is stretched or recovers from the stretch, wrinkles tend to occur on the corners. This problem may be prevented by the design of straight bridges in the corners.

In the present embodiment, the connecting bridges in the middle display area 1012 and some connecting bridges in the transition display area 1011 may be S-shaped. The connecting bridges have a symmetrical structure, and a symmetry axis of the connecting bridges is perpendicular to connecting lines between centers of two adjacent pixel islands connected to the connecting bridges.

Please refer to FIG. 6. Specifically, in the present embodiment, the S-shaped curved bridges include a first connecting part 1201, a first curved part 1202, a second curved part 1203, a third curved part 1204, and a second connecting part 1202 which are sequentially connected. Wherein, the first connecting part 1201 is connected to one pixel island 11, and the second connecting part 1205 is connected to another pixel island 11 adjacent to the former pixel island 11.

The S-shaped curved bridges further include a plurality of straight parts configured to connect adjacent curved parts or configured to connect curved parts with connecting parts adjacent thereto.

In the present embodiment, the pixel islands in the main display area have a rectangular structure and include four lateral edges. Each lateral edge of the pixel islands in the middle display area 1012 and each lateral edge (except for the outermost side) of the pixel islands in the transition display area 1011 are connected to four S-shaped curved bridges. The four S-shaped curved bridges have a symmetrical structure with respect to a center of the pixel island connected to the four S-shaped curved bridges.

In one embodiment, the edge display area 102 is provided with a circle of the opening groups 13 surrounding the transition display area 13. Correspondingly, the outermost side of the edge display area 102 includes a circle of pixel islands adjacent to the opening groups 13.

Please refer to FIG. 7. In the present embodiment, a connecting bridge connected to a fifth pixel island 115 disposed at a corner of the circle of the pixel islands is a straight first connecting bridge 121. Another connecting bridge connected to the fifth pixel island 115 is an S-shaped curved bridge. Connecting bridges connected to other pixel islands of the circle may be an S-shaped curved bridge. Alternatively, two connecting bridges connected to the fifth pixel island 115 may be the straight first connecting bridge 121.

Figure 8:
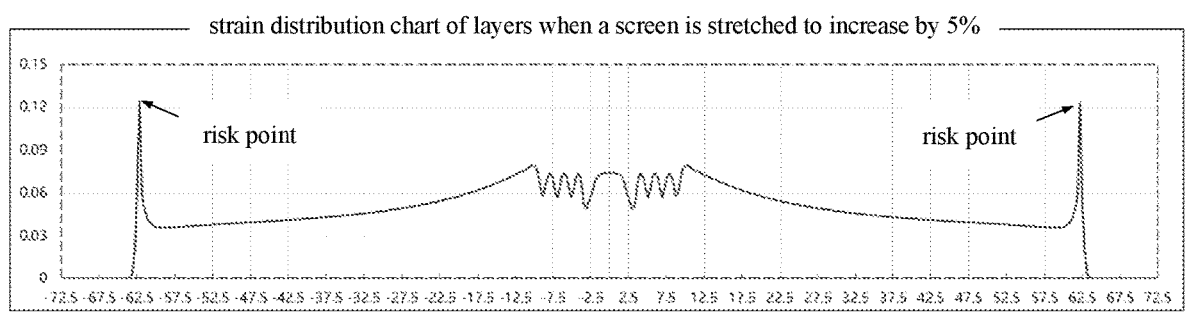
FIG. 8 is a curve graph showing changes in applied forces in different positions of the stretchable display module provided by an embodiment of the present disclosure.

A simulation may be conducted with a conventional stretched display module (each island bridge in a display area has a same appearance). In the present embodiment, a simulation is conducted with a 145 mm*145 mm display module. As shown in FIG. 8, a horizontal axis is a side length of the display module, a position where the coordinate axis is 0 corresponds to a center of the display area, and a vertical axis is a strain of the display module. A simulation result shows that applied forces significantly concentrate on an edge of the display area and reaches a peak, indicating that when the side length of the display module is stretched to increase by 5%, the edge of display area is easily broken. A position and a size of the edge of the display module can be confirmed by a finite element method. In the present embodiment, an area of the display area occupies 95% of an area of the display module. The position of the edge of the display module can be seen in FIG. 8. A width of the edge of the display module is 4.8 mm, and the edge of the display module may be the transition display area. Specifically, widths of the connecting bridges in the edge area gradually increase along the direction from the display area to the non-display area, thereby improving tensile performance of the edge area.

Specifically, please refer to FIG. 5. In the present embodiment, widths of connecting bridges L1 in the middle area 1012 area are equal and range from 15 to 25 μm, and 25 μm is preferred in this embodiment. Widths of connecting bridges L2 in the first sub-area 10111 are equal and range from 25 to 30 μm, and 28 μm is preferred in this embodiment. Widths of connecting bridges L3 in the second sub-area 10112 area are equal and range from 30 to 33 μm, and 31 μm is preferred in this embodiment. Widths of connecting bridges L4 in the third sub-area 10113 are equal and rage from 33 to 35 μm, and 34 μm is preferred in this embodiment.

Distances between the pixel islands 11 are fixed. Therefore, when the widths of the connecting bridges in the first sub-area 10111, the second sub-area 10112, and the third sub-area 10113 gradually increase, correspondingly, distances between the connecting bridges and the curved parts in the first sub-area 10111, the second sub-area 10112, and the third sub-area 10113 gradually decrease. That is, an area of a hollow area gradually decreases. In the present embodiment, the distances between the pixel islands 11 may be 244 μm.

Specifically, please refer to FIG. 5. In the present embodiment, in the S-shaped curved bridges in the middle display area 1012, a distance 51 between the first connecting part and the first curved part may be 21 μm, a distance S2 between a straight part connecting the first connecting part to the first curved part and a straight part connecting the first curved part with the second curved part may be 34 μm, and a distance S3 between a straight part connecting the first curved part with the second curved part and a straight part connecting the second curved part with the third curved part may be 34 μm. Correspondingly, in the S-shaped bridges in the first sub-area 10111, a distance S4 may be 24 μm, a distance S5 may be 28 μm, and a distance S6 may be 28 μm. In the S-shaped bridges in the second sub-area 10112, a distance S7 may be 24 μm, a distance S8 may be 24 μm, and a distance S9 may be 24 μm. In the S-shaped bridges in the third sub-area 10113, a distance S10 may be 22 μm, a distance S11 may be 21 μm, and a distance S12 may be 22 μm.

Please refer to FIG. 7, a shape of the first opening 1311 of the opening groups 13 may be determined according to a shape of the connecting bridge between two pixel islands 11 adjacent to the first opening 1311. If the connecting bridge is a regularly straight first connecting bridge, the shape of the first opening 1311 may also be designed to be regularly straight, thereby defining the first connecting bridge. If the connecting bridge is a curved bridge, the shape of the first opening 1311 may be designed to be irregular, thereby defining the S-shaped curved bridge.

Please refer to FIG. 1, numbers of the openings 131 of the opening groups 13 in different positions may be different. Specifically, if the connecting bridge between two pixel islands adjacent to the first opening 1311 protrudes from sides of the two pixel islands near the non-display area NA, a number of openings of the opening group 13 where the first opening 1311 is defined may be designed to be less. On the other hand, if the connecting bridge between two pixel islands adjacent to the first opening 1311 does not protrude from sides of the two pixel islands near the non-display area NA, the number of openings of the opening group 13 where the first opening 1311 is defined may designed to be greater.

Figure 9:
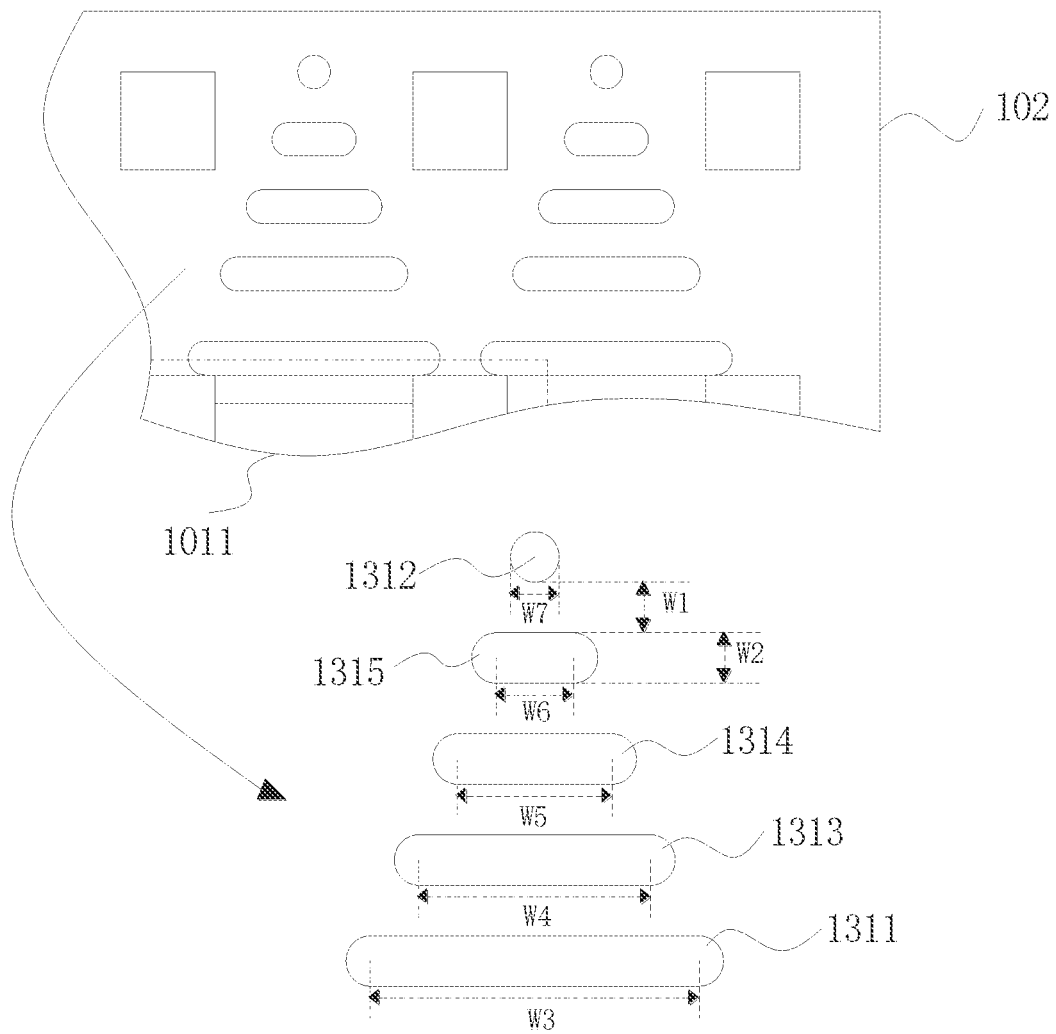
FIG. 9 is a structural schematic view showing a corner of the edge display area provided by the embodiment of the present disclosure.

Please refer to FIG. 7 and FIG. 9. In the present embodiment, a connecting bridge connected to the fifth pixel island 115 in a corner of the transition display area 1011 includes a straight first connecting bridge 121 and an S-shaped curved bridge. The S-shaped curved bridge does not protrude from sides of two pixel islands near the non-display area, wherein the two pixel islands are connected to and adjacent to the S-shaped curved bridge. The connecting bridges adjacent to the first opening 1311 in the transition display area 1011 are S-shaped curved bridges except for the first connecting bridges 121 at corners of the transition display area 1011. Correspondingly, the first opening 1311 adjacent to the first connecting bridge 121 may be regularly strip-shaped, and other first openings 1311 may have an irregular shape.

Figure 10:
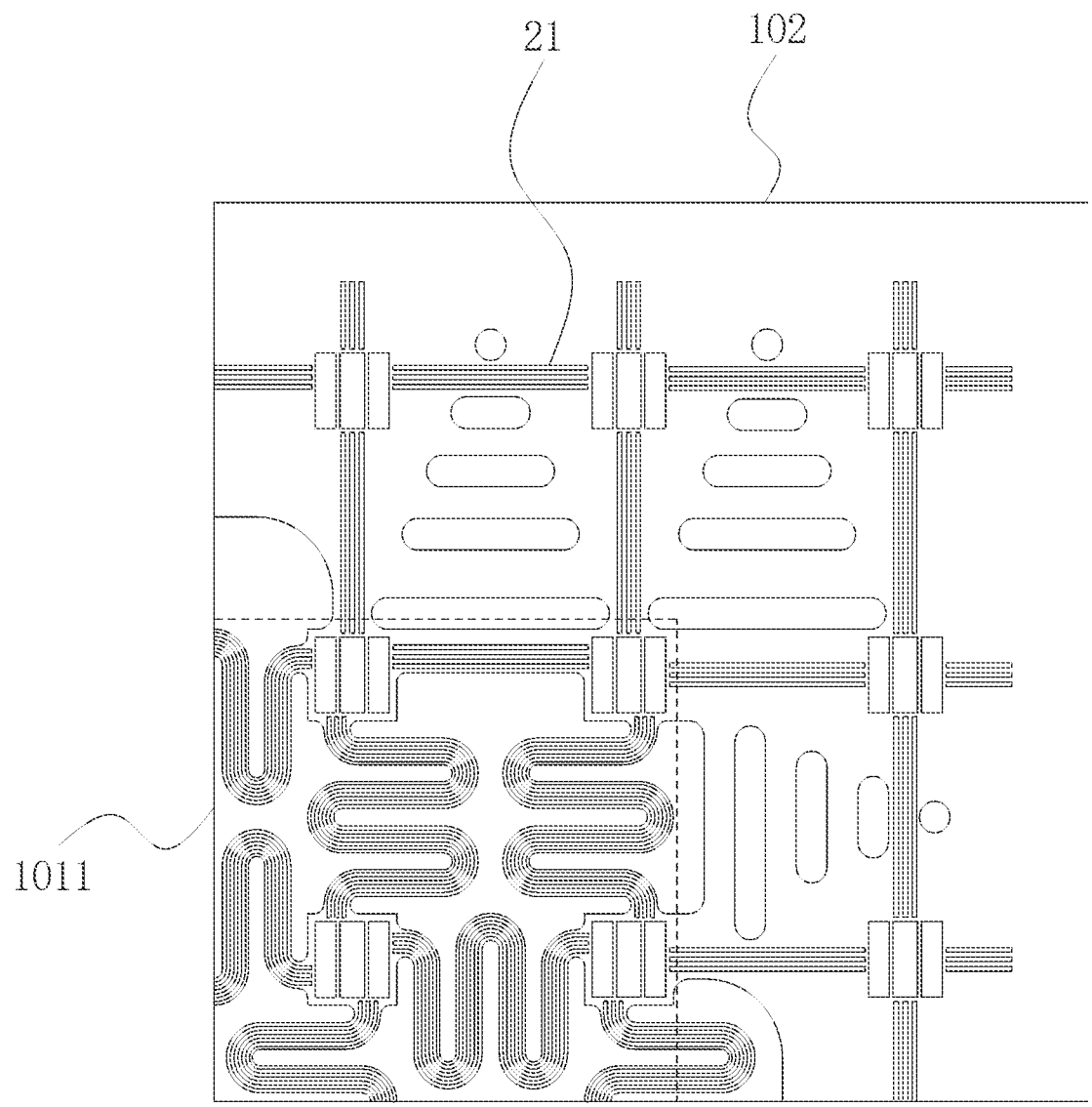
FIG. 10 is a structural schematic view showing wires provided by an embodiment of the present disclosure.

Please refer to FIG. 10, a strain of the edge display area 102 is relatively low during a stretch process, and a flexible substrate in the edge display area 102 has an opening design instead of a curved bridge design. Therefore, a plurality of wires 21 in the edge display area 102 may be straight. The wires 21 on the straight first connecting bridges in the transition display area 1011 may be straight, and the other wires on the connecting bridges in the display area are curved.

Please refer to FIG. 9. In the present embodiment, the shape of openings of opening groups adjacent to the first connecting bridge 121 includes strip-shaped, distances W1 between adjacent openings are equal, and widths W2 of the openings are equal.

The opening groups adjacent to the first connecting bridge 121 include five openings, i.e., the first opening 1311, a third opening 1313, a fourth opening 1314, a fifth opening 1315, and a second opening 1312, and an area of the above-mentioned five openings gradually decreases. The opening groups adjacent to the S-shaped curved bridges may include four openings or five openings.

Furthermore, the distances W1 between the openings are equal to the widths of the openings. In the present embodiment, the widths of the openings and the distances between the openings may be 40 µm.

Lengths of the openings gradually decrease along the direction from the display area AA to the non-display area NA. In the present embodiment, the openings may have a strip-shaped structure with circular chamfers at two ends. Because an area of the openings gradually decreases, the last opening (the second opening 1312) may be a circular opening. In the present embodiment, a characteristic length W3 of the first opening 1311 may be 280 µm, a characteristic length W4 of the third opening 1313 may be 200 µm, a characteristic length W5 of the fourth opening 1314 may be 120 µm, and a diameter of the second opening 1312 may be 40 µm. The above-mentioned characteristic lengths do not include lengths of the circular chamfers.

Figure 11:
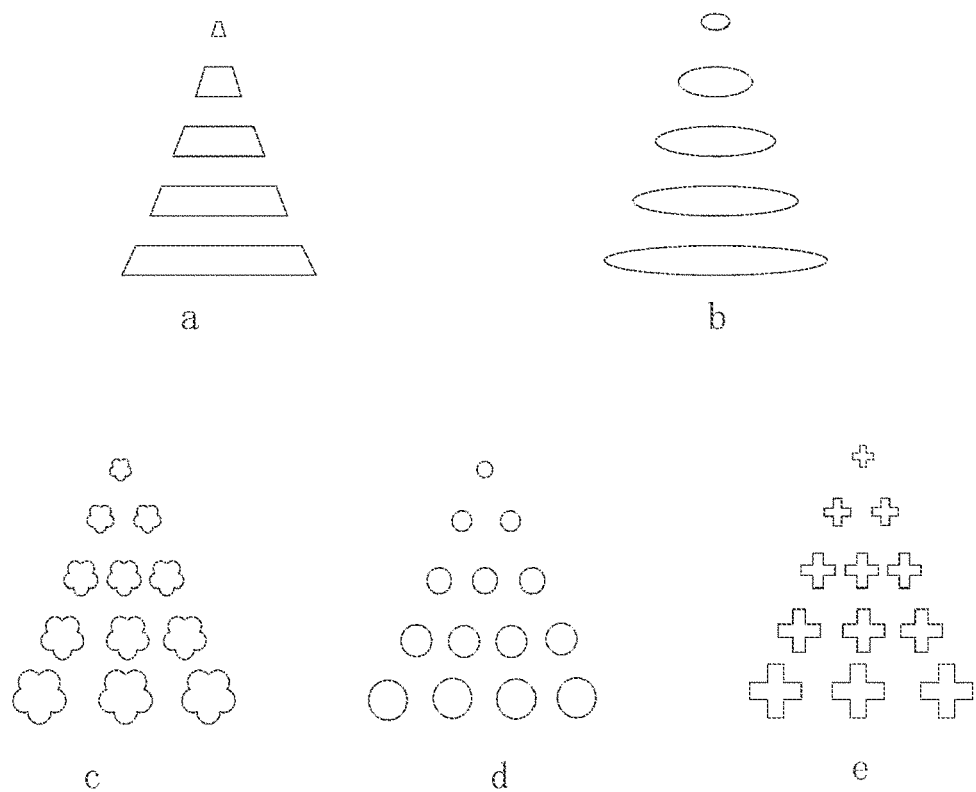
FIG. 11 is a structural schematic view showing an opening group provided by an embodiment of the present disclosure.

In other embodiments, as shown (a) to (e) in FIG. 11, the openings of the opening groups may also be strip-shaped, circular, ellipse-shaped, trapezoid-shaped, cruciform-shaped, or quincunx-shaped, which are not limited. However, an area of the openings should gradually decrease along the direction from the edge display area to the non-display area.

Figure 12:
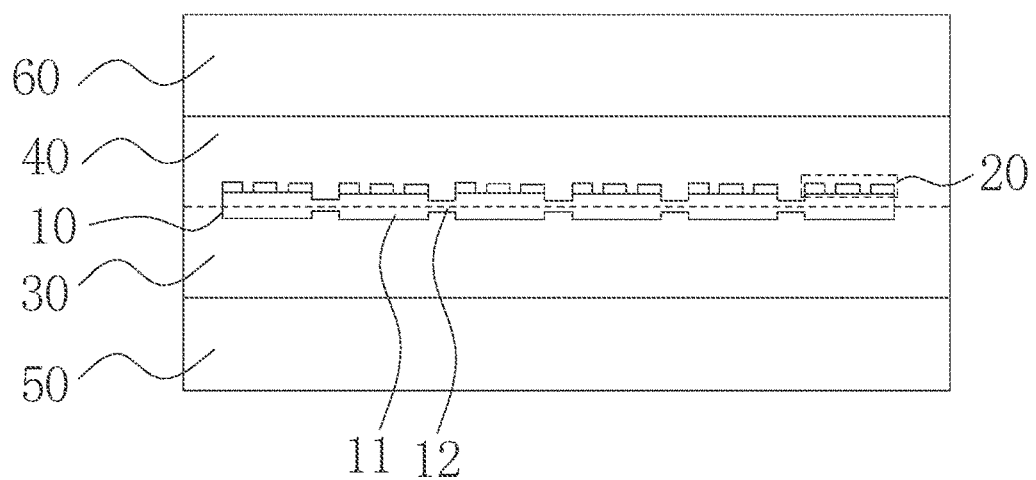
FIG. 12 shows stacked layers of the stretchable display module provided by the embodiment of the present disclosure.

Please refer to FIG. 12. The stretchable display module provided by the present disclosure may have a symmetrical structure along its thickness direction. Specifically, layers at two opposite sides of a flexible substrate 10 encapsulating a display device are symmetrical to each other with respect to the flexible substrate 10.

A first optical adhesive layer 30 and a second optical adhesive layer 40 are respectively filled in two opposite sides of the flexible substrate 10, wherein the first optical adhesive layer 30 and the second adhesive layer 40 are filled in the hollow structure of the display area 101 and the opening groups in the edge display area 102 and cover two opposite surfaces of the flexible substrate 10, respectively. A first flexible layer 50 is disposed on a side of the first optical adhesive layer 30 away from the flexible substrate 10, and a second flexible layer 60 is disposed on a side of the second optical adhesive layer 40 away from the flexible substrate 10.

A thickness of the first optical adhesive layer 30 is equal to a thickness of the second optical adhesive layer 40, and a thickness of the first flexible layer 50 is equal to a thickness of the second flexible layer 60.

A material of the first flexible layer 50 and a material of the second flexible layer 60 include polydimethylsiloxane (PDMS) having great stretchability and light transmittance.

A material of the flexible substrate 10 may be polyimide (PI), or may be other flexible materials. In the present embodiment, the thickness of the flexible substrate 10 may range from 5 to 7 µm. An elastic modulus of the flexible substrate 10 may range from 2.8 to 3.2 GPa, thereby maintaining good mechanical stability at high temperatures. Therefore, the flexible substrate 10 may have great insulation, corrosion resistance, and weather resistance, and can work at high temperatures reaching 400° C. and not be broken at a temperature of −269° C.

In the present embodiment, one pixel island 11 is provided with a pixel 20. Each pixel 20 includes three sub-pixels with three different colors, for example a red sub-pixel, a green sub-pixel, and a blue sub-pixel. In other embodiments, the pixel 20 may further include a white sub-pixel.

Figure 13:
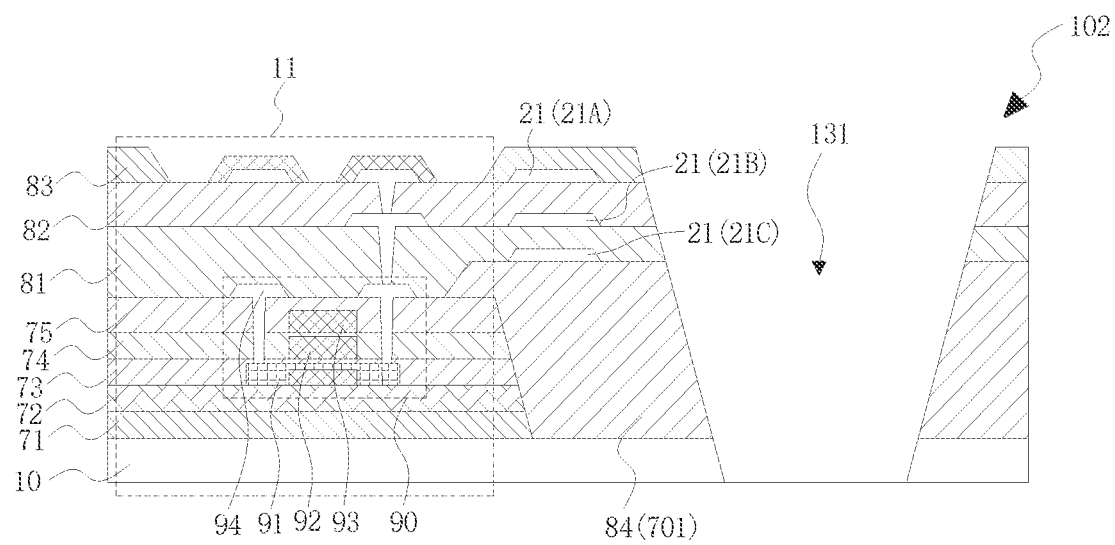
FIG. 13 shows stacked layers on a flexible substrate in the edge display area provided by the embodiment of the present disclosure.

Please refer to FIG. 13. FIG. 13 shows stacked layers on the flexible substrate 10 in the edge display area. In the present embodiment, the stretchable display module further includes an organic layer 80 and an inorganic layer 70 stacked on the flexible substrate 10. The openings 131 pass through the organic layer, the inorganic layer 70, and the flexible substrate 10.

Specifically, the organic layer 80 and the inorganic layer 70 on the flexible substrate 10 at the openings 131 are fully removed, and the openings 131 are filled with an optical adhesive.

The pixel island 11 is provided with a driving layer 90 and a luminescent device layer electrically connected to the driving layer 90. Layers in the driving layer 90 and layers in the luminescent device layer may be separated from each other by inorganic layers or organic layers.

Specifically, the driving layer 90 may include a thin-film transistor (TFT) array layer. The TFT array layer includes an active layer 91, a first gate 92, a second gate 93, and a source/drain layer 94. The luminescent device layer is disposed on the driving layer 90. The luminescent device layer includes an anode, a luminescent layer, and a cathode. The anode is electrically connected to a source and a drain on the source/drain layer 94 via a through-hole. The anode may be a combination layer of copper and molybdenum. In other embodiments, the anode may also be formed of other conductive materials.

An area where the pixel island 11 is disposed is provided with a first blocking layer 71, a second blocking layer 72, a first gate insulating layer 73, a second gate insulating layer 74, an interlayer dielectric layer 75, a first planarization layer 81, a second planarization layer 82, and a third planarization layer 83, which are sequentially stacked on the flexible substrate 10.

The active layer 91 is disposed on the second blocking layer 72. The first gate insulating layer 73 is disposed on the active layer 91. The first gate 92 is disposed on the first gate insulating layer 73. The second insulating layer 74 is disposed on the first gate 92. The second gate 93 is disposed on the second gate insulating layer 74. The interlayer dielectric layer 75 is disposed on the second gate 93. The source/drain layer 94 is disposed on the interlayer dielectric layer 75. The first planarization layer 81 is disposed on the source/drain layer 94. A bridge layer is disposed on the first planarization layer 81. The second planarization layer 82 is disposed on the bridge layer. The luminescent device layer is disposed on the second planarization layer 82. The third planarization layer 83 is disposed on the second planarization layer 82.

An area where the wires 21 are disposed includes an organic filling layer 84, a first planarization layer 81, a second planarization layer 82, and a third planarization layer 83, which are sequentially stacked on the flexible substrate 10.

The first blocking layer 71, the second blocking layer 72, the first gate insulating layer 73, the second gate insulating layer 74, and the interlayer dielectric layer 75 may be an inorganic layer.

The organic filling layer 84, the first planarization layer 81, the second planarization layer 82, and the third planarization layer may be an organic layer.

The openings 131 pass through the third planarization layer 83, the second planarization layer 82, the first planarization layer 81, and the organic filling layer 84.

The wires 21 between adjacent pixel islands 11 in the edge display area 102 include at least one wiring layer. An inorganic layer corresponding to a first side of the at least one wiring layer near the flexible substrate 10 has a hollow structure. That is, the inorganic layer corresponding the first side of the wiring layer is fully removed, wherein the first side is a side of the wiring layer near the flexible substrate 10.

The first side of the wiring layer corresponding to the flexible substrate 10 is defined with a recess 701. The recess 701 penetrates an inorganic layer between the wiring layer and the flexible substrate 10. The recess 701 is filled with the organic filling layer 84.

The flexible substrate 10 is mainly configured to be a carrier of the driving layer 90, the luminescent device layer, and the wires 21. The blocking layer, a buffer layer, the gate insulating layer, and the interlayer insulating layer have great capability to block moisture and oxygen, thereby protecting the driving layer 90. The planarization layer on the driving layer 90 can encapsulate the source/drain layer, thereby alleviating a problem of height difference caused by stacked inorganic layers and improving flatness of the entire stacked structure. Therefore, the luminescent device layer may have an excellent flat substrate.

The inorganic layer includes an inorganic material such as nitrogen silicide or oxygen silicide, thereby having insulating function and capability to block moisture and oxygen.

The organic layer may include an organic insulating material such as polyimide compounds or polyacrylamide compounds, thereby preventing oxygen and moisture from entering the wiring layers and metal devices.

Please refer to FIG. 13, in the present embodiment, the wires 21 between the pixel islands 11 in the edge display area 102 are divided into three layers insulated from each other. Along a direction away from the flexible substrate 10, the wires 21 may include three wiring layers, namely a wiring layer 21C, a wiring layer 21B, and a wiring layer 21A, which are not limited. Also, the wires 21 may have a singular wiring layer design, a double wiring layer design, or a multiple wiring layer design. A side of the wiring layers away from the flexible substrate 10 is provided with a planarization layer.

The wiring layer 21A, the wiring layer 21B, and the wiring layer 21C, which are adjacent to each other, are insulated from each other by the planarization layer. The inorganic layers below and corresponding to the wiring layer 21C are removed to form the recess 701. The recess 701 passes through the first blocking layer 71, the second blocking layer 72, the first gate insulating layer 73, the second gate insulating layer 74, and the interlayer insulating layer 75. The organic filling layer 84 is filled in the recess 701. An organic layer is disposed between the wiring layer 21C and the substrate 10, thereby improving flexibility of an area where the wires 21 are disposed.

The wires 21 may be metal wires and may be disposed on a same layer as metal devices of the luminescent device layer and a driving layer 90, thereby saving manufacturing processes and reducing layer thickness. Specifically, the wiring layers may be disposed on a same layer as at least one of the metal layers including the gate layer, the source/drain layer, or the anode. In the present embodiment, the wiring layer 21C may be disposed on a same layer as the source/drain layer 94, the wiring layer 21B may be disposed on a same layer as the bridge layer, and the wiring layer 21A may be disposed on a same side as the anode of the luminescent layer.

An embodiment of the present disclosure further provides a stretchable display device. The stretchable display device includes the stretchable display module 100 of the above-mentioned embodiments. In the present disclosure, the stretchable display device may be used in fields of flexible human-computer interactive display, medical display, freely stretchable vehicle-mounted display terminal, and wearable display terminal products.

In embodiments of the present disclosure, an edge display area is provided with a plurality of opening groups instead of an island-bridge structure. The opening groups include a plurality of openings arranged from the edge display area to a non-display area, and an area of the openings gradually decreases from the edge display area to the non-display area. Therefore, rigidity of the edge display area can be improved, and overly large deformation of the edge display area can be prevented. Furthermore, wrinkles can be prevented from forming on the edge display area, especially in corners of the edge display area.

A stretchable display module and a stretchable display device have been described in detail by the above embodiments, which illustrate principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. A stretchable display module, comprising a display area and a non-display area surrounding the display area, wherein the display area comprises a main display area and an edge display area defined between the main display area and the non-display area; wherein the stretchable display module comprises:
   a plurality of pixel islands distributed in the display area in an array manner, wherein each of the pixel islands is provided with at least one pixel; and
   a plurality of connecting bridges, wherein each of the connecting bridges is connected to two adjacent pixel islands in the main display area;
   wherein a plurality of opening groups are disposed between adjacent pixel islands in the edge display area, each of the opening groups comprises a plurality of openings arranged from the edge display area to the non-display area, and an area of the openings gradually decreases from the edge display area to the non-display area;
   wherein each of the opening groups comprises a first opening, an area of the first opening is larger than an area of other openings in a same opening group, the first opening comprises a first end and a second end opposite to each other, the first end does not exceed a connecting line between a center of a first pixel island and a center of a second pixel island, the second end does not exceed a connecting line between a center of a third pixel island and a center of a fourth pixel island, the first pixel island is disposed in the main display area and is adjacent to the first end, the second pixel island is adjacent to the first pixel island along a direction from the edge display area to the non-display area and is disposed in the edge display area, the third pixel island is disposed on a same side as the first pixel island and is adjacent to the second end, and the fourth pixel island is adjacent to the third pixel island along the direction from the edge display area to the non-display area and is disposed in the edge display area.

2. The stretchable display module of claim 1, wherein each of the opening groups further comprises a second opening, an area of the second opening is smaller than an area of other openings in a same opening group, and the second opening is defined on a side of a connecting line between the center of the second pixel island and the center of the fourth pixel island adjacent to the non-display area.

3. The stretchable display module of claim 2, wherein lengths of the openings in a same opening group gradually decrease along a direction from the display area to the non-display area.

4. The stretchable display module of claim 3, wherein in the same opening group, a length ratio of two adjacent openings ranges from 1/2 to 3/4.

5. The stretchable display module of claim 3, wherein in the same opening group, distances between adjacent openings are equal.

6. The stretchable display module of claim 5, wherein the opening group comprises an axisymmetric structure, and a symmetry axis of the opening group is perpendicular to a connecting line between the center of the first pixel island and the center of the third pixel island.

7. The stretchable display module of claim 1, wherein the openings are strip-shaped, circular, ellipse-shaped, trapezoid-shaped, cruciform-shaped, or quincunx-shaped.

8. The stretchable display module of claim 1, wherein a circle of the opening groups is disposed in the edge display area and surrounds the main display area.

9. The stretchable display module of claim 1, wherein the main display area comprises a transition display area adjacent to the edge display area, and widths of the connecting bridges in the transition display area gradually increase along a direction from the main display area to the non-display area.

10. The stretchable display module of claim 9, wherein the connecting bridges between the plurality of pixel islands adjacent to the opening groups in the transition display area comprise at least one straight first connecting bridge.

11. The stretchable display module of claim 10, wherein the connecting bridges between the adjacent pixel islands in corners of the transition display area comprise the at least one first connecting bridge.

12. The stretchable display module of claim 9, wherein the transition display area comprises a first sub-area, a second sub-area, and a third sub-area, which are arranged along the direction from the main display area to the non-display area, wherein widths of the connecting bridges in the first sub-area, widths of the connecting bridges in the second sub-area, and widths of the connecting bridges of the third sub-area gradually increase along the direction from the main display area to the non-display area.

13. The stretchable display module of claim 1, further comprising a flexible substrate, and an organic layer and an inorganic layer which are stacked on the flexible substrate, wherein the openings penetrate the organic layer, the inorganic layer, and the flexible substrate.

14. A stretchable display device, comprising a stretchable display module; wherein the stretchable display module comprises a display area and a non-display area surrounding the display area, and the display area comprises a main display area and an edge display area defined between the main display area and the non-display area;
wherein the stretchable display module comprises:
a plurality of pixel islands distributed in the display area in an array manner, wherein each of the pixel islands is provided with at least one pixel; and
a plurality of connecting bridges, wherein each of the connecting bridges is connected to two adjacent pixel islands in the main display area;
wherein a plurality of opening groups are disposed between adjacent pixel islands in the edge display area, each of the opening groups comprises a plurality of openings arranged from the edge display area to the non-display area, and an area of the openings gradually decreases from the edge display area to the non-display area;
wherein each of the opening groups comprises a first opening, an area of the first opening is greater than an area of other openings in a same opening group, the first opening comprises a first end and a second end, which are opposite to each other, the first end does not exceed a connecting line between a center of a first pixel island and a center of a second pixel island, the second end does not exceed a connecting line between a center of a third pixel island and a center of a fourth pixel island, the first pixel island is disposed in the main display area and is adjacent to the first end, the second pixel island is adjacent to the first pixel island along a direction from the edge display area to the non-display area and is disposed in the edge display area, the third pixel island is disposed on a same side as the first pixel island and is adjacent to the second end, and the fourth pixel island is adjacent to the third pixel island along the direction from the edge display area to the non-display area and is disposed in the edge display area.

15. The stretchable display device of claim 14, wherein each of the opening groups further comprises a second opening, an area of the second opening is less than an area of other openings in a same opening group, and the second opening is defined on a side of a connecting line between the center of the second pixel island and the center of the fourth pixel island adjacent to the non-display area.

16. The stretchable display device of claim 15, wherein lengths of the openings in a same opening group gradually decrease along a direction from the display area to the non-display area.

17. The stretchable display device of claim 16, wherein in the same opening group, a length ratio of two adjacent openings ranges from 1/2 to 3/4.

18. The stretchable display device of claim 16, wherein in the same opening group, distances between adjacent openings are equal.

* * * * *